(12) United States Patent
Kawagoe et al.

(10) Patent No.: US 8,152,044 B2
(45) Date of Patent: Apr. 10, 2012

(54) SOLAR BATTERY MODULE PRODUCTION METHOD AND SOLAR BATTERY MODULE PRODUCTION APPARATUS

(75) Inventors: Yoshikazu Kawagoe, Nara (JP); Hiroshi Kanishi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 165 days.

(21) Appl. No.: 10/584,712

(22) PCT Filed: Nov. 25, 2004

(86) PCT No.: PCT/JP2004/017491
§ 371 (c)(1),
(2), (4) Date: Jun. 26, 2006

(87) PCT Pub. No.: WO2005/064694
PCT Pub. Date: Jul. 14, 2005

(65) Prior Publication Data
US 2007/0079862 A1    Apr. 12, 2007

(30) Foreign Application Priority Data
Dec. 25, 2003 (JP) ................................. 2003-430442

(51) Int. Cl.
*B23K 1/00* (2006.01)
*B32B 31/08* (2006.01)

(52) U.S. Cl. ........ 228/47.1; 228/101; 136/244; 136/252; 156/311; 156/324

(58) Field of Classification Search .................. 136/244, 136/252; 228/47.1, 101; H01L 31/04
See application file for complete search history.

(56) References Cited

U.S. PATENT DOCUMENTS
2,983,304 A  *  5/1961  Rasero ........................... 474/267
(Continued)

FOREIGN PATENT DOCUMENTS
DE        32 38 187 A1    4/1984
(Continued)

OTHER PUBLICATIONS

Translation of the International Preliminary Report on Patentability mailed Aug. 3, 2006 in corresponding PCT Application No. PCT/JP2004/017491.
(Continued)

*Primary Examiner* — Jessica L Ward
*Assistant Examiner* — Devang R Patel
(74) *Attorney, Agent, or Firm* — Nixon & Vanderhye P.C.

(57) ABSTRACT

A method of producing a solar battery module. The method uses a producing apparatus having a positioning belt and a heating belt adjacent to each other such that an object can be delivered between the belts, and also having a pressing belt opposite the positioning belt and the heating belt, the pressing belt being provided so as to straddle the positioning belt and the heating belt. In the producing apparatus, the heating belt and the pressing belt are controlled to a predetermined temperature. The method has steps where solar battery cells and inter-connectors required to connect the solar battery cells are transported to the downstream side of the positioning belt after positioned on the upstream side of the positioning belt, the solar battery cells and the inter-connectors transported up to the downstream side of the positioning belt are delivered onto the heating belt while being held by the positioning belt and the pressing belt, and the solar battery cells and the inter-connectors delivered to the heating belt are soldered while being transported, held between the heating belt and the pressing belt.

9 Claims, 7 Drawing Sheets

U.S. PATENT DOCUMENTS

| | | | |
|---|---|---|---|
| 3,580,795 A | | 5/1971 | Eichenlaub |
| 3,883,386 A | * | 5/1975 | Garbini et al. ............... 156/498 |
| 4,534,502 A | | 8/1985 | Piurek |
| 4,997,507 A | * | 3/1991 | Meyer ............................ 156/286 |
| 5,379,228 A | * | 1/1995 | Matsuda et al. ............. 700/212 |
| 5,601,015 A | | 2/1997 | Röttger et al. |
| 5,674,542 A | * | 10/1997 | Focke et al. .................. 425/297 |
| 6,309,506 B1 | * | 10/2001 | Kannegiesser et al. ....... 156/312 |
| 6,367,530 B1 | * | 4/2002 | Shimotomai ................ 156/382 |

FOREIGN PATENT DOCUMENTS

| | | |
|---|---|---|
| EP | 0 095 843 A2 | 12/1983 |
| EP | 0 291 756 A2 | 11/1988 |
| EP | 1 302 988 A2 | 4/2003 |
| EP | 1 783 837 A1 | 5/2007 |
| JP | 62-042468 | 2/1987 |
| JP | 1-501433 | 5/1989 |
| JP | 11254526 A * | 9/1999 |
| JP | 11278626 A * | 10/1999 |
| JP | 2000-22188 | 1/2000 |
| JP | 2000022188 A * | 1/2000 |
| JP | 2003-188402 | 7/2003 |
| JP | 2004-273914 | 9/2004 |

OTHER PUBLICATIONS

International Search Report for PCT/JP04/17491 dated Mar. 22, 2005 (English & Japanese).

Supplemental European Search Report in corresponding European patent application No. 04820876.3 dated Aug. 4, 2011 (4 pages).

* cited by examiner (a)

(b)

(c)

(d)

(e)

SOLAR BATTERY MODULE PRODUCTION METHOD AND SOLAR BATTERY MODULE PRODUCTION APPARATUS

TECHNICAL FIELD

This application is the US national phase of international application PCT/JP2004/017491 filed 25 Nov. 2004, which designated the U.S. and claims priority to JP 2003-430442 filed 25 Dec. 2003, the entire content of each of which is hereby incorporated by reference.

The disclosed technology relates to a solar battery module production method and a solar battery module production apparatus and, more specifically, to a production method and a production apparatus which improve productivity in production of solar battery modules.

BACKGROUND ART

A solar battery module includes a plurality of solar battery cells connected in series by bonding interconnectors to electrodes of the solar battery cells by electric welding (see, for example, Japanese Unexamined Patent Publication No. SHO62(1987)-42468).

In general, the output of each solar battery cell is low on the order of several watts, so that a solar battery module including a plurality of solar battery cells electrically connected for providing a proper output is utilized for photovoltaic generation by a solar battery.

In a production process for the solar battery module, a solar battery string is prepared by serially connecting light receiving surface electrodes and rear surface electrodes of adjacent solar battery cells by elongated interconnectors.

The connection of the light receiving electrodes and the rear surface electrodes of the adjacent solar battery cells by the interconnectors is achieved by an electric welding method or a soldering method. Recently, the soldering method has been dominant.

In the soldering method, an interconnector is placed on a solder-coated electrode of a solar battery cell in proper positional relation, and the soldering is generally achieved by locally applying hot air to the electrode while pressing the placed interconnector by a press pin, or by locally irradiating the electrode by a heater lamp.

With an increasing demand for the solar battery cells, a more productive and efficient soldering method is required.

SUMMARY

In view of the foregoing, an aspect the present invention provides a solar battery module production method and a solar battery module production apparatus which ensure that solar battery cells are efficiently connected to one another with high productivity.

In an embodiment, there is provided a first solar battery module production method which comprises: utilizing a production apparatus including a positioning belt and a heating belt located adjacent each other in a transferable manner and a press belt extending over the positioning belt and the heating belt in opposed relation to the positioning belt and the heating belt, and adapted to control the heating belt and the press belt at predetermined temperatures; positioning a plurality of solar battery cells and interconnectors required for connection of the solar battery cells on an upstream portion of the positioning belt and transporting the solar battery cells and the interconnectors to a downstream portion of the positioning belt; transferring the solar battery cells and the interconnectors transported to the downstream portion of the positioning belt onto the heating belt while holding the solar battery cells and the interconnectors between the positioning belt and the press belt; and holding the solar battery cells and the interconnectors transferred onto the heating belt between the heating belt and the press belt and soldering the interconnectors to the solar battery cells while transporting the solar battery cells and the interconnectors.

In another embodiment, the plurality of solar battery cells and the interconnectors required for the connection of the solar battery cells are positioned on the positioning belt. The solar battery cells and the interconnectors thus positioned are held between the positioning belt and the press belt and transferred onto the heating belt. Then, the solar battery cells and the interconnectors transferred onto the heating belt are held between the heating belt and the press belt, and soldered while being transported. Thus, the soldering of the solar battery cells and the interconnectors can be efficiently achieved with high productivity.

DETAILS

Figure 1:
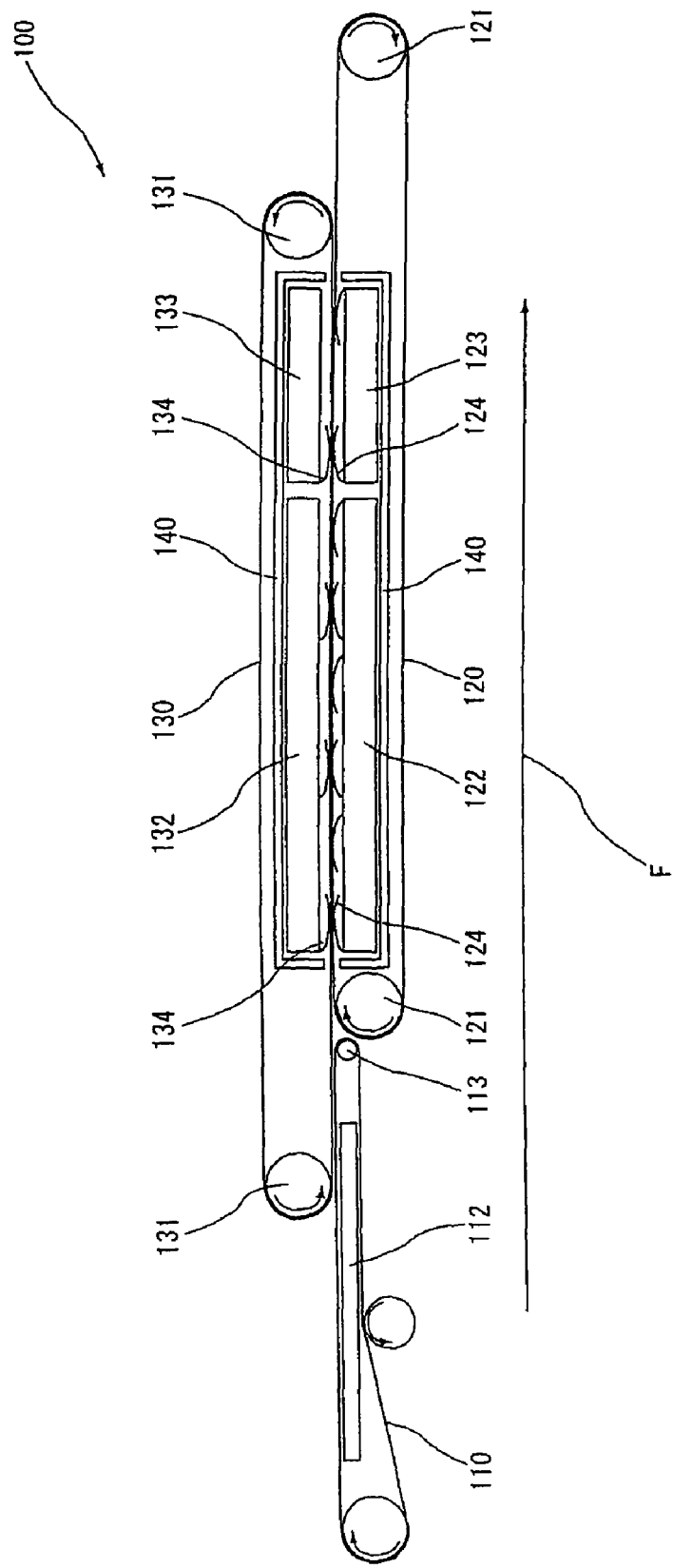
FIG. 1 is an explanatory diagram illustrating the schematic construction of a production apparatus.

A first production method for a solar battery module includes: utilizing a production apparatus which includes a positioning belt and a heating belt located adjacent each other in a transferable manner and a press belt extending over the positioning belt and the heating belt in opposed relation to the positioning belt and the heating belt, and is adapted to control the heating belt and the press belt at predetermined temperatures; positioning a plurality of solar battery cells and interconnectors required for connection of the solar battery cells on an upstream portion of the positioning belt and transporting the solar battery cells and the interconnectors to a downstream portion of the positioning belt; transferring the solar battery cells and the interconnectors transported to the downstream portion of the positioning belt onto the heating belt while holding the solar battery cells and the interconnectors between the positioning belt and the press belt; and holding the solar battery cells and the interconnectors transferred onto the heating belt between the heating belt and the press belt and soldering the interconnectors to the solar battery cells while transporting the solar battery cells and the interconnectors.

In this disclosure, the solar battery module is herein defined as a solar battery string including a plurality of solar battery cells electrically connected to one another by interconnectors, or a module including a solar battery string sealed in a transparent resin and attached to a frame.

The solar battery cells each include, for example, a photoelectric conversion layer, and a light receiving surface electrode and a rear surface electrode respectively provided on front and rear surfaces of the photoelectric conversion layer.

The photoelectric conversion layer is, for example, a p- or n-type silicon substrate having a thickness of about 200 µm to about 400 µm and including a pn junction layer formed by diffusing an n- or p-type impurity therein.

The light receiving surface electrode and the rear surface electrode are formed, for example, by applying a metal paste containing metal powder on the front and rear surfaces of the photoelectric conversion layer by printing by a screen printing method or the like, and firing the metal paste.

The light receiving surface electrode may be, for example, a comb-shaped electrode including an elongated connection electrode to be connected to an interconnector and minute grid electrodes perpendicularly crossing the connection electrode. Further, the light receiving surface electrode may be composed of, for example, silver.

On the other hand, the rear surface electrode may include a rear surface aluminum electrode provided on substantially the entire rear surface of the photoelectric conversion layer and partly having an opening, and a connection silver electrode provided in the opening of the rear surface aluminum electrode to be connected to the interconnector.

The connection electrode of the light receiving surface electrode and the connection silver electrode of the rear surface electrode are preferably preliminarily coated with a solder for the subsequent soldering of the interconnector.

The interconnector may have, for example, an elongated rod shape, a plate shape or a round rod shape. The interconnector may be composed of, for example, copper.

In the first solar battery module production method, at least a surface of the positioning belt may be composed of a resin.

With this arrangement, the positioning belt is highly flexible, so that the diameter of a pulley around which the positioning belt is entrained can be reduced.

Therefore, a gap between the positioning belt and the heating belt located adjacent each other in a transferable manner can be eliminated as much as possible, so that displacement of the solar battery cells and the interconnectors and impacts on the solar battery cells can be suppressed as much as possible when the solar battery cells and the interconnectors are transferred from the positioning belt to the heating belt.

More specifically, the positioning belt may include, for example, a fabric core having a surface portion impregnated with a resin.

Exemplary materials for the core include nylon filaments, polyester filaments, polyamide filaments, hemp fibers, cotton fibers and steel filaments.

Examples of the resin for the impregnation include polyurethane resins, silicone resins, Teflon (registered trade name) resins and synthetic rubbers.

In the first solar battery module production method, the positioning belt may have vacuum suction holes for transporting the solar battery cells and the interconnectors positioned on the upstream portion of the positioning belt to the downstream portion of the positioning belt in a properly positioned state.

In the first solar battery module production method, the heating belt and the press belt may each be composed of a thin metal.

In the first solar battery module production method, opposed portions of the heating belt and the press belt may be surrounded by a shroud, and the inside of the shroud may be kept in a nitrogen atmosphere.

According to another aspect, there is provided a first solar battery module production apparatus to be used for the first solar battery module production method, the production apparatus comprising a positioning belt and a heating belt located adjacent each other in a transferable manner, and a press belt extending over the positioning belt and the heating belt in opposed relation to the positioning belt and the heating belt, wherein the heating belt and the press belt are each controlled at a predetermined temperature.

In the first solar battery module production apparatus, at least a surface of the positioning belt may be composed of a resin.

In the first solar battery module production apparatus, the positioning belt may have vacuum suction holes for transporting solar battery cells and interconnectors positioned on an upstream portion of the positioning belt to a downstream portion of the positioning belt in a properly positioned state.

In the first solar battery module production apparatus, the heating belt and the press belt may each be composed of a thin metal.

In the first solar battery module production apparatus, opposed portions of the heating belt and the press belt may be surrounded by a shroud, and the inside of the shroud may be kept in a nitrogen atmosphere.

According to further another aspect of the present invention, there is provided a second solar battery module production method which includes: utilizing a production apparatus including a heating belt and a press belt disposed in opposed relation and a resilient member which biases the heating belt and the press belt toward each other, and adapted to control the heating belt and the press belt at predetermined temperatures; holding a plurality of solar battery cells and interconnectors required for connection of the solar battery cells between the heating belt and the press belt in a properly positioned state; and soldering the interconnectors to the solar battery cells while transporting the solar battery cells and the interconnectors.

In the second production method, the solar battery cells and the interconnectors properly positioned are held between the heating belt and the press belt, and soldered while being transported. Therefore, the interconnectors can be efficiently soldered to the solar battery cells with high productivity.

Further, the heating belt and the press belt are biased toward each other by the resilient member. Therefore, the heating belt and the press belt easily fit on the solar battery cells which are liable to be warped by heat when the solar battery cells held between the heating belt and the press belt are soldered during transportation. This prevents a great force from locally acting on the warped solar battery cells. As a result, cracking of the solar battery cells is suppressed.

In the second solar battery module production method, the resilient member may be a leaf spring.

According to still another aspect, there is provided a second solar battery module production apparatus to be used for the second solar battery module production method, the production apparatus comprising a heating belt and a press belt disposed in opposed relation, and a resilient member which biases the heating belt and the press belt toward each other, wherein the heating belt and the press belt are each controlled at a predetermined temperature.

In the second solar battery module production apparatus, the resilient member may be a leaf spring.

An embodiment of the present invention will hereinafter be described in detail with reference to the attached drawings.

EMBODIMENT

Figure 8:
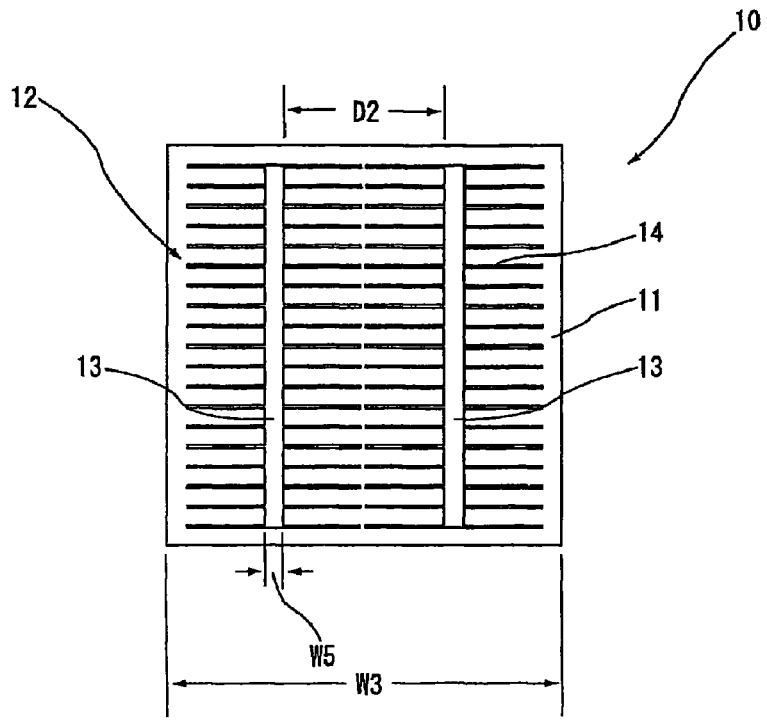
FIG. 8 is a plan view of a solar battery cell.
Figure 9:
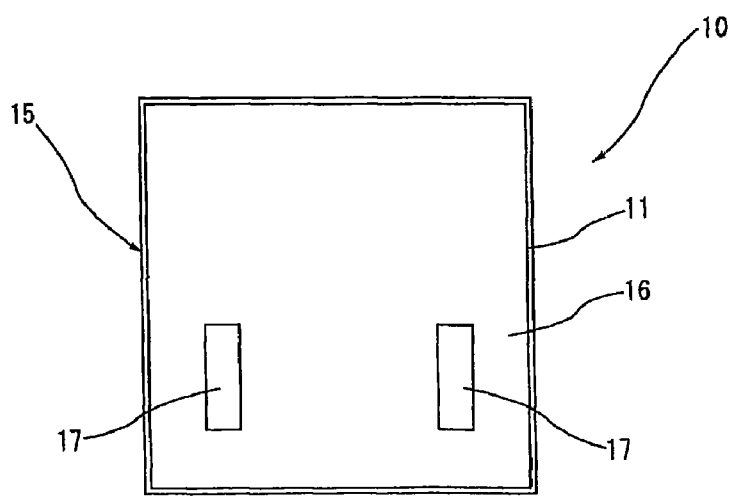
FIG. 9 is a bottom view of the solar battery cell shown in FIG. 8.
Figure 10:
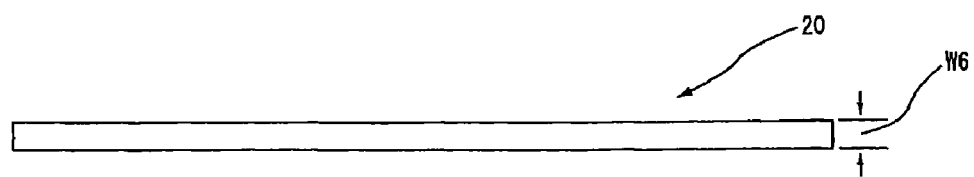
FIG. 10 is a plan view of an interconnector.
Figure 11:
FIG. 11 is a side view of the interconnector shown in FIG. 10.
Figure 12:
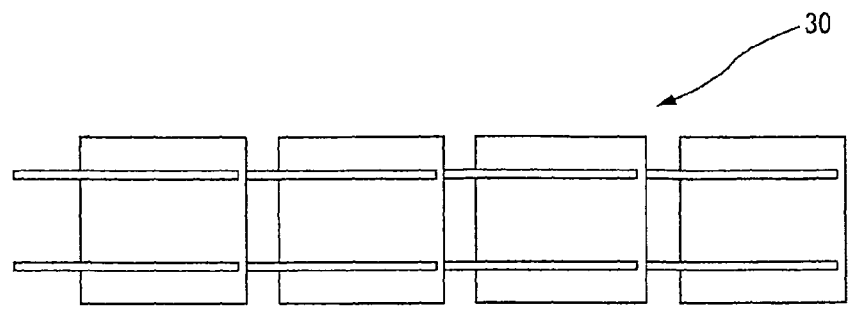
FIG. 12 is a plan view of the solar battery string.
Figure 13:
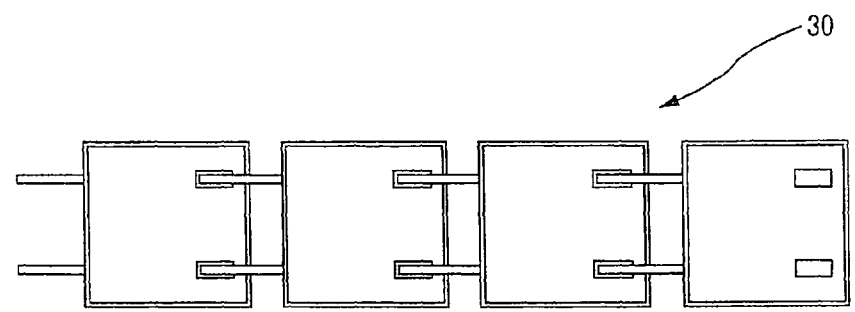
FIG. 13 is a bottom view of the solar battery string shown in FIG. 12.

In an embodiment, solar battery cells each shown in FIGS. 8 and 9 are electrically connected to one another by interconnectors each shown in FIGS. 10 and 11 to prepare a solar battery string shown in FIGS. 12 and 13. In a process for connecting the solar battery cells by the interconnectors, a production apparatus as shown in FIG. 1 is used.

Solar Battery Cells

The solar battery cells to be used in the embodiment will be described with reference to FIGS. 8 and 9. FIG. 8 is a plan view of the solar battery cell to be used in this embodiment, and FIG. 9 is a bottom view of the solar battery cell shown in FIG. 8.

As shown in FIGS. 8 and 9, the solar battery cell 10 to be used in this embodiment includes a photoelectric conversion layer 11, a light receiving surface electrode 12 provided on a light receiving surface of the photoelectric conversion layer 11, and a rear surface electrode 15 provided on a rear surface of the photoelectric conversion layer 11.

The photoelectric conversion layer 11 is a p-type silicon substrate having an n-type diffusion layer formed in a surface thereof. The light receiving electrode 12 includes two connection electrodes 13 to be respectively soldered to interconnectors 20 (see FIGS. 10 and 11), and grid electrodes 14 perpendicularly crossing the connection electrodes 13. The connection electrodes 13 and the grid electrodes 14 are composed of silver.

The rear surface electrode 15 includes an aluminum electrode 16 provided on substantially the entire rear surface of the photoelectric conversion layer 11, and connection silver electrodes 17 provided in openings of the aluminum electrode 16 to be respectively soldered to interconnectors 20.

The connection electrodes 13 of the light receiving surface electrode and the connection silver electrodes 17 of the rear surface electrode are preliminarily coated with a lead-free solder. The solar battery cell 10 shown in FIG. 8 has a width W3 of 126 mm, and the connection electrodes 13 are spaced a distance D2 of 62 mm from each other.

Interconnectors

The interconnectors to be used in this embodiment will be described with reference to FIGS. 10 and 11. FIG. 10 is a plan view of the interconnector to be used in this embodiment, and FIG. 11 is a side view of the interconnector shown in FIG. 10.

As shown in FIGS. 10 and 11, the interconnector 20 to be used in this embodiment is an elongated planar copper plate having a width W6 of 1.5 mm and a thickness T1 of 0.3 mm.

Production Apparatus

Figure 2:
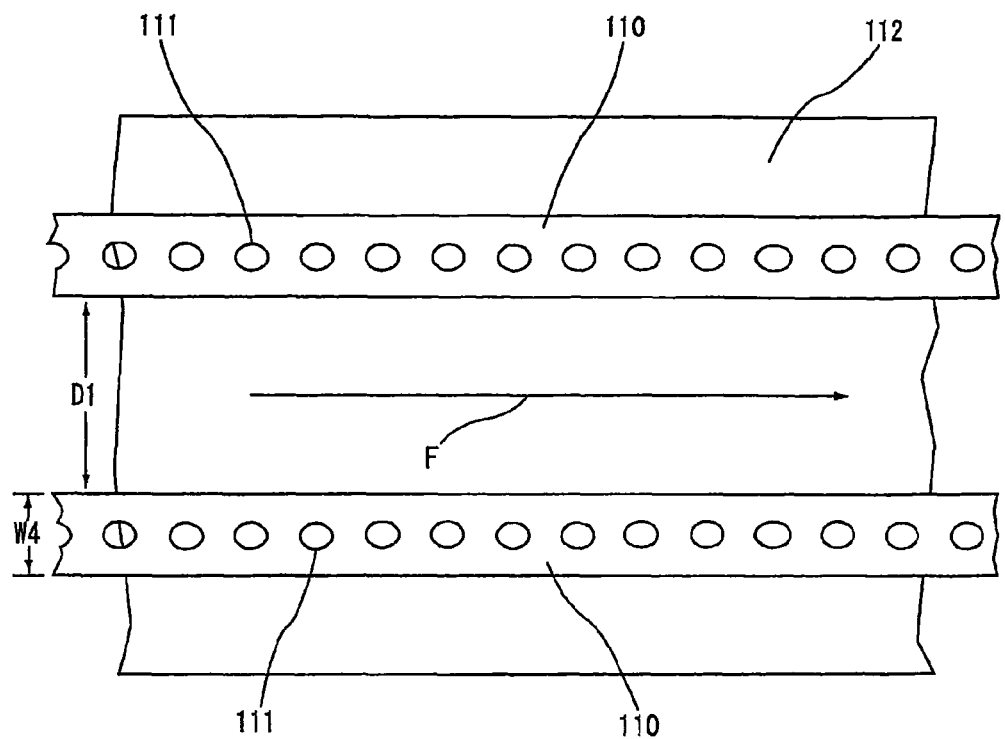
FIG. 2 is an enlarged partial view of a positioning belt.
Figure 3:
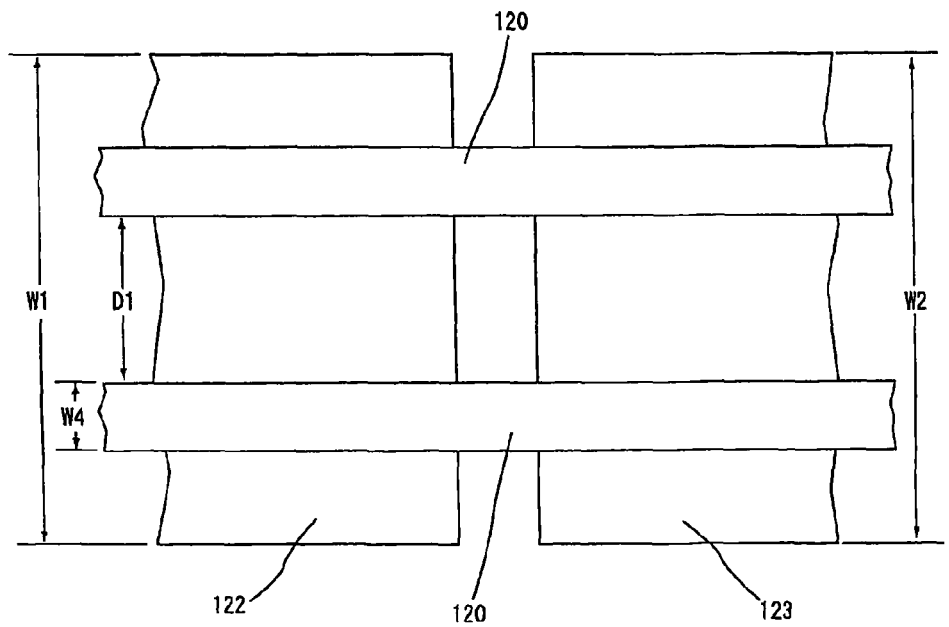
FIG. 3 is an enlarged partial view of a heating belt.
Figure 4:
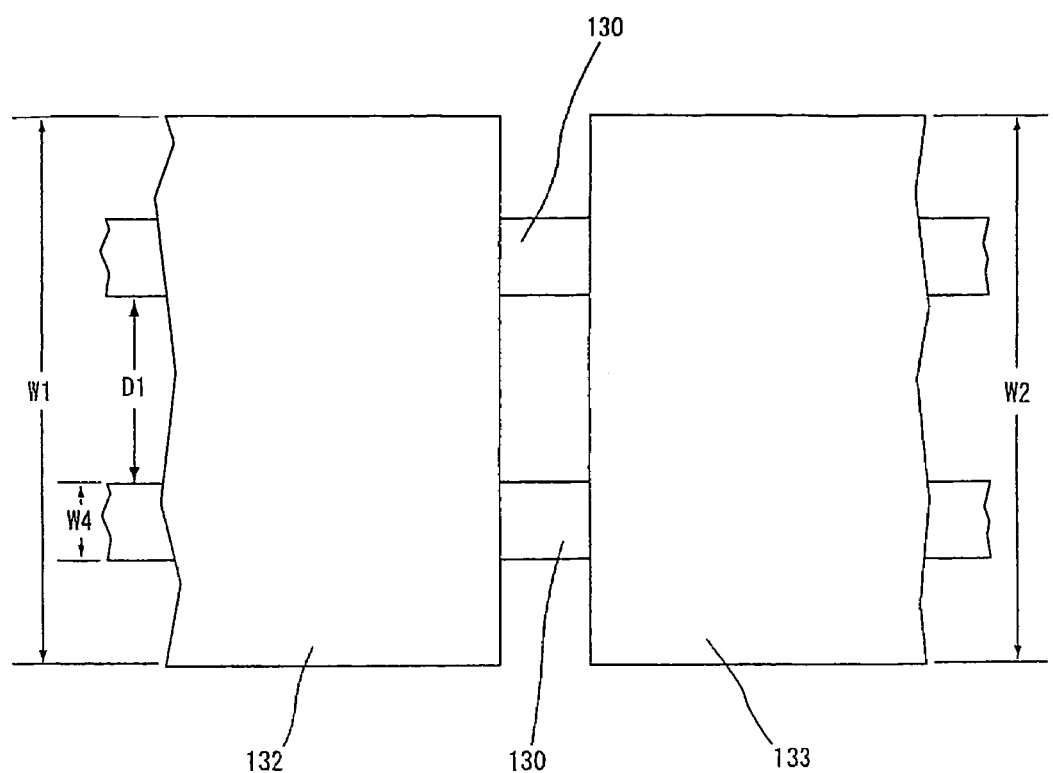
FIG. 4 is an enlarged partial view of a press belt.
Figure 14:
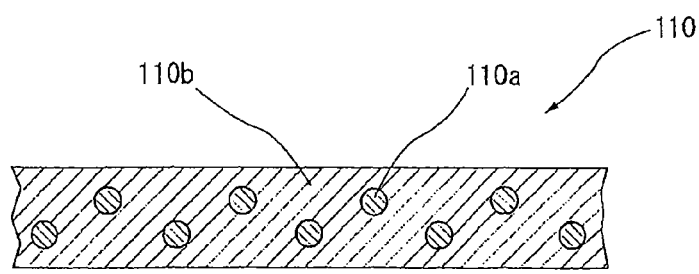
FIG. 14 is an enlarged partial sectional view of the positioning belt.

An embodiment of a production apparatus to be used will be described with reference to FIGS. 1 to 4 and FIG. 14. FIG. 1 is an explanatory diagram illustrating the schematic construction of the production apparatus and FIG. 2 is an enlarged partial plan view of a positioning belt. FIG. 3 is an enlarged partial plan view of a heating belt, and FIG. 4 is an enlarged partial plan view of a press belt. FIG. 14 is an enlarged partial sectional view of the positioning belt.

As shown in FIG. 1, the production apparatus to be used in this embodiment includes a positioning belt 110 and a heating belt 120 located adjacent each other in a transferable manner and a press belt 130 extending over the positioning belt 110 and the heating belt 120 in opposed relation to the positioning belt 110 and the heating belt 120, and is adapted to control the heating belt 120 and the press belt 130 at predetermined temperatures.

As shown in FIG. 1, the main components of the production apparatus 100 are the positioning belt 110 which is adapted to position solar battery cells 10 (see FIGS. 8 and 9) and interconnectors 20 (see FIGS. 10 and 11) thereon and transport the solar battery cells 10 and the interconnectors 20 to the heating belt 120, and the heating belt 120 and the press belt 130 which are adapted to hold the solar battery cells 10 and the interconnectors 20 received from the positioning belt 110 therebetween and solder the interconnectors 20 to the solar battery cells 10 while transporting the solar battery cells 10 and the interconnectors 20.

The press belt 130 functions to press the solar battery cells 10 and the interconnectors 20 positioned on an upstream portion of the positioning belt 110 from an upper side and transfer the solar battery cells 10 and the interconnectors 20 to the heating belt 120, and to hold the solar battery cells 10 and the interconnectors 20 transferred to the heating belt 120 between the heating belt 120 and the press belt 130 and solder the interconnectors 20 to the solar battery cells 10 while transporting the solar battery cells 10 and the interconnectors 20.

A robot (not shown) for placing the solar battery cells 10 and the interconnectors 20 on the positioning belt 110 in proper positional relation is disposed upstream of the positioning belt 110.

As shown in FIG. 2, the positioning belt 110 has vacuum suction holes 111 aligned in a transport direction F for transporting the solar battery cells 10 and the interconnectors 20 (see FIG. 5(a)) placed in proper positional relation on the positioning belt 110 by the robot while holding the solar battery cells 10 and the interconnectors 20 in a properly positioned state.

As shown in FIGS. 1 and 2, a vacuum suction block 112 for vacuum suction through the vacuum suction holes 111 is disposed on a back side of the positioning belt 110.

A gap defined between the positioning belt 110 and the heating belt 120 located adjacent each other should be eliminated as much as possible. Therefore, the positioning belt 110 is entrained around a pulley 113 having a small diameter at a position adjacent to the heating belt 120 as shown in FIG. 1.

Therefore, the positioning belt 110 is preferred to have excellent flexibility. In this embodiment, as shown in FIG. 14, a resin belt prepared by impregnating a core material 110a of nylon filaments with a polyurethane resin 110b is used as the positioning belt 110.

In this embodiment, the pulley 113 for the positioning belt 110 disposed adjacent the heating belt 120 has a diameter of 1 cm, and pulleys 121, 131 around which the heating belt 120 and the press belt 130 are respectively entrained each have a diameter of 10 cm.

The heating belt 120 and the press belt 130, which are required to have excellent heat conductivity, are metal belts. Therefore, the heating belt 120 and the press belt 130 are not as flexible as the resin belt. This makes it difficult to reduce the diameters of the pulleys 121, 131 for the heating belt 120 and the press belt 130.

As shown in FIG. 1, electric heating blocks 122, 132 and water cooling blocks 123, 133 are disposed on back sides of the heating belt 120 and the press belt 130. The heating belt 120 and the press belt 130 are respectively controlled at predetermined temperatures by thermocouples (not shown) provided in the heating blocks 122, 132 and the cooling blocks 123, 133.

The lengths of the heating blocks 122, 132 as measured in the transport direction F are determined according to the melting point of the solder and outputs of the heating blocks 122, 132.

As an example, the heating blocks 122, 132 each can have a length of 100 cm as measured in the transport direction F, and the heating temperatures of the heating blocks 122, 132 can be respectively set at 265° C. and 250° C.

As shown in FIGS. 3 and 4, the heating blocks 122, 132 each have a width W1 which is determined according to the width W3 (see FIG. 8) of the solar battery cells 10 so as to heat the entire surfaces of the solar battery cells 10 by radiation heat.

In this embodiment, it is assumed that solar battery cells 10 each having an edge length of 126 mm are connected to one another. Therefore, the heating blocks 122, 132 each have a width W1 of 18 cm.

A reason why the entire surfaces of the solar battery cells 10 are heated is as follows. If the solar battery cells 10 were locally heated for soldering the interconnectors 20, the solar battery cells 10 would be significantly warped after the connection of the interconnectors 20, resulting in cracking of the solar battery cells 10 in the subsequent sealing step. In this embodiment, the entire surfaces of the solar battery cells 10 are heated, so that the solar battery cells entirely experience expansion and contraction. Therefore, heat stress can be reduced. Thus, the warp of the solar battery cells 10 is suppressed.

As shown in FIG. 1, the lengths of the cooling blocks 123, 133 as measured in the transport direction F are determined according to the solidification temperature of the melted solder and the heat releasing capacities of the cooling blocks 123, 133.

In this embodiment, the cooling blocks 123, 133 each have a length of 30 cm as measured in the transport direction F. As shown in FIGS. 3 and 4, the cooling blocks 123, 133 each have a width W2 of 18 cm.

As shown in FIG. 1, the heating belt 120 and the press belt 130 are biased toward each other by leaf springs 124, 134 attached to the heating blocks 122, 132 and the cooling blocks 123, 133.

This makes it possible to alleviate impacts acting on the solar battery cells 10 during the transportation and to allow the heating belt 120 and the press belt 130 to easily fit on the solar battery cells 10 warped by the heating. Thus, the cracking of the warped solar battery cells 10 is prevented which may otherwise occur when a great force locally acts on the solar battery cells 10.

However, if a biasing force applied to the heating belt 120 by the press belt 130 is too great, the warped solar battery cells are forcibly pressed to be cracked. Therefore, the biasing force to be applied by the press belt 130 should be particularly carefully determined. In this embodiment, the springs 124 to be used for biasing the heating belt 120 are each capable of applying a biasing force of 50 to 100 g, and the springs 134 to be used for biasing the press belt 130 are each capable of applying a biasing force of 50 to 100 g. The press belt 130 has its own weight, so that the number of the springs 134 for biasing the press belt 130 is less than the number of the springs 124 for biasing the heating belt 120.

As shown in FIG. 3, the heating belt 120 has no vacuum suction holes 111 (see FIG. 2) unlike the positioning belt 110. If the heating belt 120 had vacuum suction holes, the vacuum suction holes would be clogged by the melted solder in the soldering, and protuberances would be locally formed on surfaces of the interconnectors 20 as corresponding to the vacuum suction holes after the soldering.

If the protuberances were locally formed on the surfaces of the interconnectors 20, a great force would locally act on the protuberances when the solar battery cells are sealed with a transparent resin sheet in the subsequent sealing step. This leads to the cracking of the solar battery cells 10.

In this embodiment, therefore, the positioning belt 110 for positioning and transporting the solar battery cells 10 and the interconnectors 20 is separately provided, as shown in FIG. 1, to eliminate the need for providing the vacuum suction holes in the heating belt 120.

As shown in FIG. 1, opposed portions of the heating belt 120 and the press belt 130 are surrounded by a shroud 140, and the inside of the shroud 140 is kept in a nitrogen atmosphere in consideration of the use of the lead-free solder. The shroud 140 has a gas introduction port (not shown) for introducing nitrogen gas into the shroud 140.

In this embodiment, it is assumed that the solar battery cells 10 (see FIG. 8) each having two connection electrodes 13 are connected to one another. Therefore, the positioning belt 110, the heating belt 120 and the press belt 130 each include two belts as shown in FIGS. 2 to 4.

A distance D1 between the two belts (see FIGS. 2 to 4) is determined according to the distance D2 of the connection electrodes 13 of each of the solar battery cells 10 (see FIG. 8).

In this embodiment, as described above, the distance D2 between the two connection electrodes is 62 mm, and the width W5 of each of the connection electrodes is 1.5 mm. The width W6 of each of the interconnectors 20 connected to the connection electrodes 13 is 1.5 mm. Therefore, the distance D1 between the two belts (see FIGS. 2 to 4) is 35 mm, and the width W4 of each of the belts is 40 mm.

If the solar battery cells each have a single connection electrode, a single positioning belt, a single heating belt and a single press belt may be provided though not shown. If the solar battery cells each have three connection electrodes, three positioning belts, three heating belts and three press belts may be provided.

Production Method For Solar Battery String

Figure 5:
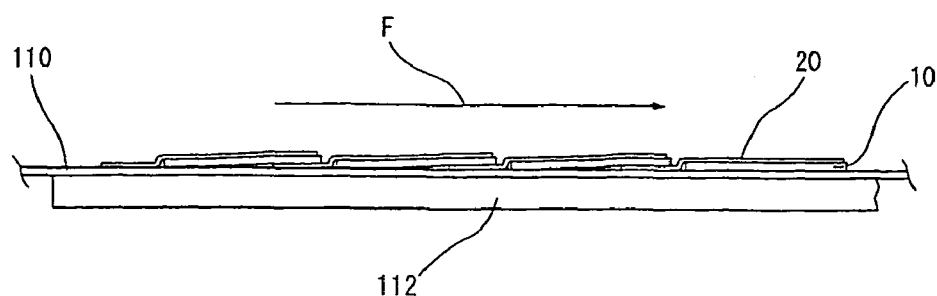
FIGS. 5 are process diagrams showing a production method for a solar battery string.
Figure 5:
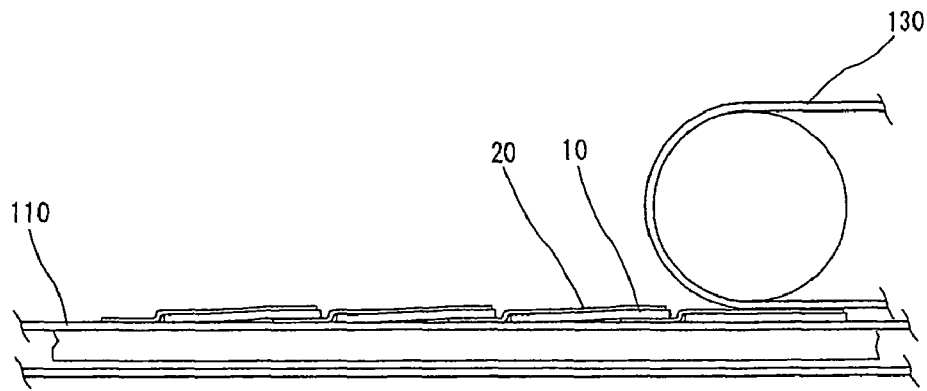
Figure 6:
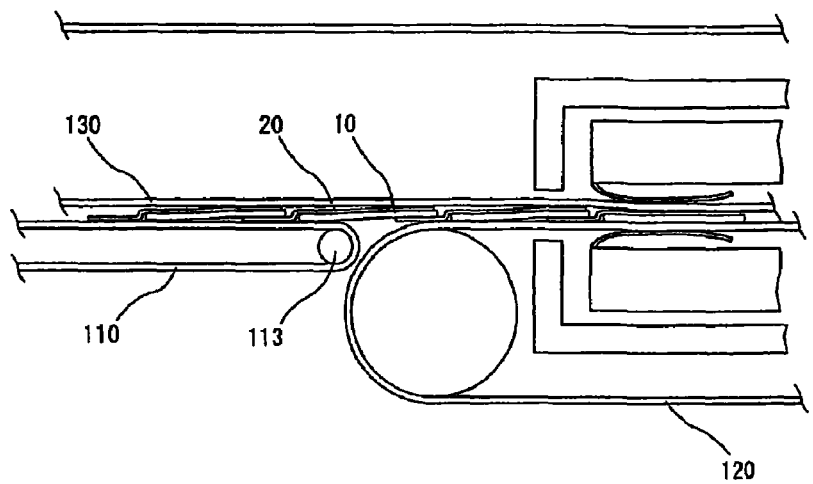
FIGS. 6 are process diagrams showing a solar battery string production method.
Figure 6:
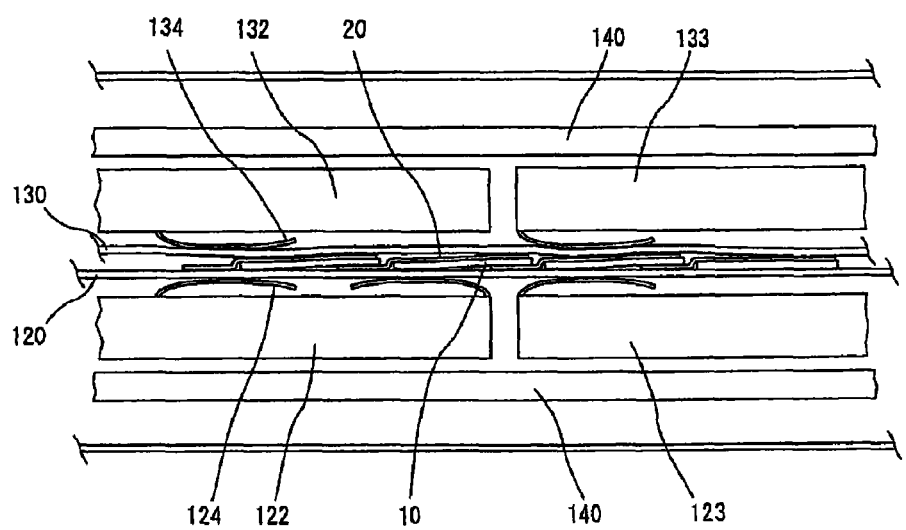
Figure 7:
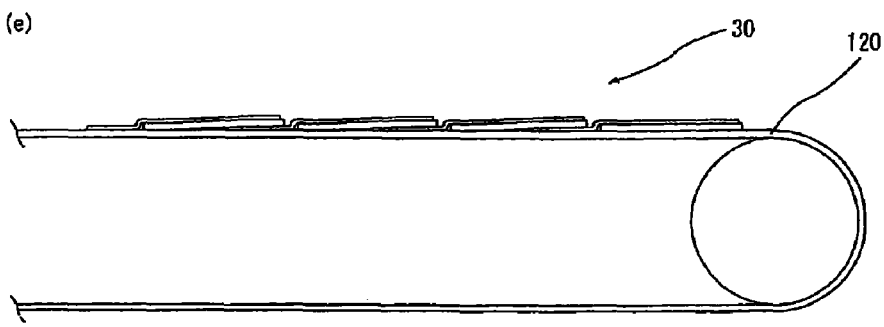
FIG. 7 is a process diagram showing another solar battery string production method.

An example production method for the solar battery string will be described with reference to FIGS. 5 to 7. FIGS. 5 to 7 are process diagrams showing the production method.

As shown in FIGS. 5 and 6, the solar battery string production method includes: positioning a plurality of solar battery cells 10 and interconnectors 20 required for connection of the solar battery cells 10 on an upstream portion of the positioning belt 110 and transporting the solar battery cells 10 and the interconnectors 20 to a downstream portion of the positioning belt 110 (FIGS. 5(a) and 5(b)); holding the solar battery cells 10 and the interconnectors 20 transported to the downstream portion of the positioning belt 110 between the positioning belt 110 and the press belt 130 and transferring the solar battery cells 10 and the interconnectors 20 onto the heating belt 120 (FIG. 6(c)); and holding the solar battery cells 10 and the interconnectors 20 transferred onto the heating belt 120 between the heating belt 120 and the press belt 130 and soldering the solar battery cells 10 and the interconnectors 20 while transporting the solar battery cells 10 and the interconnectors 20 (FIG. 6(d)). The respective steps will hereinafter be described in detail.

As shown in FIG. 5(a), the robot not shown first places a solar battery cell 10 on the upstream portion of the positioning belt 110, and then overlays interconnectors 20 on connection electrodes 13 of the placed solar battery cell 10. Since the positioning belt 110 is moved in the transport direction F, connection electrodes 17 of another solar battery cell 10 are overlaid on ends of the previously placed interconnectors 20 by continuously repeating this operation by the robot (see FIG. 9).

The solar battery cells 10 and the interconnectors 20 placed on the upstream portion of the positioning belt 110 in proper positional relation are sucked by vacuum through the vacuum suction holes 111 of the positioning belt 110 (see FIG. 2)

communicating with the vacuum suction block 112. Thus, the solar battery cells 10 and the interconnectors 20 are transported to the downstream portion of the positioning belt 110 in a properly positioned state.

When the solar battery cells 10 and the interconnectors 20 are transported to the downstream portion of the positioning belt 110, as shown in FIG. 5(b), the solar battery cells 10 and the interconnectors 20 previously placed are successively held between the positioning belt 110 and the press belt 130, and transported further downstream in the properly positioned state.

Upon reaching a downstream end of the positioning belt 110, as shown in FIG. 6(c), the solar battery cells 10 and the interconnectors 20 are successively transferred from the positioning belt 110 onto the heating belt 120 while being pressed by the press belt 130.

Since the highly flexible positioning belt 110 (see FIG. 14) prepared by impregnating the core material 110a of nylon filaments with the polyurethane resin 110b is entrained around the pulley 113 having a small diameter as described above to eliminate the gap between the positioning belt 110 and the heating belt 120 as much as possible, impacts on the solar battery cells 10 are suppressed as much as possible when the solar battery cells 10 are transported across the gap.

The solar battery cells 10 and the interconnectors 20 transferred onto the heating belt 120 are transported while being held between the heating belt 120 and the press belt 130 as shown in FIG. 6(d).

The heating belt 120 and the press belt 130 are respectively controlled at the aforementioned predetermined temperatures by the heating blocks 122, 132 and the cooling blocks 123, 133 provided on the back sides of the heating belt 120 and the press belt 130.

Therefore, the temperatures of the solar battery cells 10 and the interconnectors 20 transferred onto the heating belt 120 are increased by the heating by means of the heating blocks 122, 132 as the solar battery cells 10 and the interconnectors 20 are transported. When the temperatures are increased to not lower than 200° C., the lead-free solder coatings preliminarily applied on the connector electrodes 13 of the light receiving surface electrodes and the connection electrodes 17 of the rear surface electrodes are melted. When the solar battery cells 10 and the interconnectors 20 are further transported to reach downstream portions of the heating belt 120 and the press belt 130, the solar battery cells 10 and the interconnectors 20 are cooled to not higher than 140° C. by the cooling blocks 123, 133, whereby the melted solder is solidified. Thus, the soldering is completed.

During the soldering, the heated solar battery cells 10 are slightly warped, but the heating belt 120 and the press belt 130 biased toward each other by the leaf springs 124, 134 flexibly fit on the warped solar battery cells 10 and alleviate impacts acting on the solar battery cells 10 during the transportation. This prevents a great force from locally acting on the solar battery cells 10, thereby preventing the cracking of the solar battery cells 10.

Since the nitrogen gas is introduced into the shroud 140 surrounding the opposed portions of the heating belt 120 and the press belt 130 from the gas introduction port, the soldering can be properly performed.

The solar battery cells 10 thus soldered are further transported to be released from a pressure applied thereto by the press belt 130, and transported to a downstream end of the heating belt 120. Thus, the solar battery string 30 shown in FIGS. 12 and 13 is provided through the aforesaid steps.

In this embodiment, the transport speeds of the positioning belt 110, the heating belt 120 and the press belt 130 are set at 20 mm/sec, but may be properly adjusted according to the resulting soldered state.

Though not shown, a plurality of solar battery strings produced in the aforesaid manner are placed parallel to each other to be connected in series, and external terminals for power takeout are connected to solar battery cells located at opposite ends. After the solar battery strings are entirely sealed in a transparent resin, a light receiving surface glass and a rear surface sealing sheet are applied on the sealed solar battery strings, which are in turn surrounded by a frame. Thus, a solar battery module is provided as a product.

INDUSTRIAL APPLICABILITY

According to one or more aspects of the present invention, the interconnectors are efficiently soldered to the solar battery cells with high productivity, so that costs for the production of the solar battery module are reduced. As a result, the solar battery module can be provided at lower costs.

What is claimed is:

1. A production method for a solar battery module, comprising:
   utilizing a production apparatus including a positioning belt and a heating belt located adjacent each other in a transferable manner and a press belt extending over the positioning belt and the heating belt in opposed relation to the positioning belt and the heating belt such that the press belt overlaps at least a portion of the positioning belt, the positioning belt having a vacuum suction hole, and the heating belt having no suction hole, and adapted to control the heating belt and the press belt at predetermined temperatures;
   positioning a plurality of solar battery cells and interconnectors required for connection of the solar battery cells on an upstream portion of the positioning belt and transporting the solar battery cells and the interconnectors to a downstream portion of the positioning belt while holding the solar battery cells and the interconnectors in a properly positioned state by the action of the vacuum suction hole;
   transferring the solar battery cells and the interconnectors transported to the downstream portion of the positioning belt onto the heating belt while holding the solar battery cells and the interconnectors between the positioning belt and the press belt; and
   holding the solar battery cells and the interconnectors transferred onto the heating belt between the heating belt and the press belt and soldering the interconnectors to the solar battery cells while moving the solar battery cells and the interconnectors along the heating belt.

2. The solar battery module production method as set forth in claim 1, wherein at least a surface of the positioning belt is composed of a resin.

3. The solar battery module production method as set forth in claim 1, wherein the production apparatus further comprises at least one lower resilient member which biases the heating belt towards the press belt and at least one upper resilient member which biases the press belt toward the heating belt.

4. The solar battery module production method as set forth in claim 3, wherein one or both the at least one upper and at least one lower resilient members are leaf springs.

5. The solar battery module production method as set forth in claim 3, wherein a number of upper resilient members is less than a number of lower resilient members.

6. The solar battery module production method as set forth in claim 1, wherein the production apparatus further comprises a lower heating block disposed on a back side of the heating belt and an upper heating block disposed on a back side of the press belt, the upper and lower heating blocks adapted to heat the solar battery cells of the solar battery module; and a lower cooling block disposed on the back side of the heating belt and an upper cooling block disposed on a back side of the press belt, the upper and lower cooling blocks adapted to cool the solar battery cells of the solar battery module.

7. The solar battery module production method as set forth in claim 1, wherein at least one of the heating belt and the press belt is a metal belt.

8. The solar battery module production method as set forth in claim 1, wherein the solar battery cells and the interconnectors transported to the downstream portion of the positioning belt are held between the positioning belt and the press belt, and successively transferred from a downstream end of the positioning belt onto the heating belt while being pressed by the press belt.

9. The solar battery module production method as set forth in claim 8, wherein one part of each solar battery cell is held between the heating belt and the press belt while another part of the solar battery cell is held between the positioning belt and the press belt, when the solar battery cell is transferred from the positioning belt onto the heating belt.

\* \* \* \* \*